United States Patent [19]

D'Souza

[11] Patent Number: 5,483,181
[45] Date of Patent: Jan. 9, 1996

[54] DYNAMIC LOGIC CIRCUIT WITH REDUCED CHARGE LEAKAGE

[75] Inventor: Godfrey P. D'Souza, Santa Clara, Calif.

[73] Assignee: Sun Microsystems, Inc., Mountain View, Calif.

[21] Appl. No.: 357,033

[22] Filed: Dec. 16, 1994

[51] Int. Cl.$^6$ .................................................. H03K 19/096
[52] U.S. Cl. .............................. 326/98; 326/95; 326/171
[58] Field of Search ................................ 326/95, 98, 121

[56] References Cited

U.S. PATENT DOCUMENTS

| | | | |
|---|---|---|---|
| 4,330,722 | 5/1982 | Sampson, III | 326/98 |
| 4,780,626 | 10/1988 | Guerin | 326/98 |
| 4,797,580 | 1/1989 | Sunter | 326/98 |
| 5,015,882 | 5/1991 | Houston et al. | 326/98 |
| 5,208,489 | 5/1993 | Houston | 326/98 |

OTHER PUBLICATIONS

Neil H. E. Weste and Kamran Eshraghian, "Principles of CMOS VLSI Design, A Systems Perspective", Second Edition, Addison–Wesley Publishing Company, 1993, pp. 298–302 and 308–311.

Saburo Muroga, "VLSI System Design, When and How to Design Very–Large Scale Integrated Circuits", John Wiley & Sons, 1982, pp. 221–224.

Yasuhiko Tsukikawa, Takeshi Kajimoto, Yasuhiko Okasaka, Yoshikazu Morooka, Kiyohiro Furutani, Hiroshi Miyamoto and Hideyuki Ozaki, "An Efficient Back–Bias Generator with Hybrid Pumping Circuit for 1.5–V DRAM's", IEEE Journal of Solid–State Circuits, vol. 29, No. 4, Apr. 1994, pp. 534–538.

Ingemar Karlsson, "True Single Phase Clock Dynamic CMOS Circuit Technique", 1988 IEEE, pp. 475–478.

Yuan Ji–Ren, Ingemar Karlsson and Christer Svensson, "A True Single–Phase–Clock Dynamic CMOS Circuit Technique", IEEE Journal of Solid–State Circuits, vol. SC–22, No. 5, Oct. 1987, pp. 899–901.

Jiren Yuan, Christer Svensson, "High–Speed CMOS Circuit Technique", IEEE Journal of Solid–State Circuits, vol. 24, No. 1, Feb. 1989, pp. 62.

Patrik Larsson and Christer Svensson, "Noise in Digital Dynamic CMOS Circuits", IEEE Journal of Solid– State Circuits, vol. 29, No. 6, Jun. 1994, pp. 655–662.

Daniel W. Dobberpuhl et al., "A 200–MHz 64–b Dual . Issue CMOS Microprocessor", IEEE Journal of (List continued on next page.)

*Primary Examiner*—Edward P. Westin
*Assistant Examiner*—Andrew Sanders
*Attorney, Agent, or Firm*—Limbach & Limbach

[57] ABSTRACT

A dynamic logic circuit with reduced charge leakage includes a dynamic complementary MOSFET logic circuit with a P-type MOSFET, a number of N-type MOSFETs and a static CMOSFET inverter circuit. In response to a low clock signal, the P-type MOSFET turns on and charges the precharge node to a precharged node voltage. Some of the N-type MOSFETs are interconnected to form a logic circuit to logically process incoming logic signals and in accordance therewith selectively provide a conduction path for electrical charges from the precharge node. In response to a high clock signal, another N-type MOSFET turns on and together with the logic circuit conditionally discharges the precharge node via the logic circuit conduction path to a discharged node voltage. The value of the discharged node voltage is intermediate to the precharged node voltage and the circuit reference node voltage (e.g. VSS=0). The inverter circuit inverts and buffers the precharged and discharged node voltages. In one embodiment, a bias voltage source, connected between the N-type discharge MOSFET and the reference node, provides a bias voltage which is intermediate to the precharged and reference node voltages, and the discharged node voltage is approximately equal to the bias voltage. In another embodiment, a pull-up MOSFET is connected to the discharge MOSFET for selectively providing a pull-up voltage which is intermediate to the precharged and reference node voltages, and the discharged node voltage is approximately equal to the pull-up voltage.

33 Claims, 9 Drawing Sheets

OTHER PUBLICATIONS

Solid–State Circuits, vol. 27, No. 11, Nov. 1992, pp. 1555–1567.

Neil Weste and Kamran Eshraghian, "Principles of CMOS VLSI Design", A Systems Perspective, 1985, pp. 506–508.

Takeshi Sakata, Miyoo Itoh, Masashi Horiguchi and Masakazu Aoki, "Two–Dimensiona Power–Line Selection Scheme for Low Subthreshold–Current Multi–Gigabit DRAM's", IEEE Journal of Solid–State Circuits, vol. 29, No. 8, Aug. 1994, pp. 887–894.

Takeshi Sakata, Miyoo Itoh, Masashi Horiguchi and Masakazu Aoki, "Subthreshold–Current Reduction Circuits for Multi–Gigabit DRAM's", IEEE Journal of Solid–State Circuits, vol. 29, No. 7, Jul. 1994, pp. 761–769.

Takayuki Kawahara, Masahi Horiguchi, Yoshiki Kawajiri, Goro Kitsukawa, Tokuo Kure and Masakazu Aoki, "Subthreshold Current Reduction for Decoded–Driver by Self–Reverse Biasing", IEEE Journal of Solid–State Circuits, vol. 28, No. 11, Nov. 1993, pp. 1136–1144.

DYNAMIC LOGIC CIRCUIT WITH REDUCED CHARGE LEAKAGE

BACKGROUND OF THE INVENTION

1. Field of the Invention

The present invention relates to dynamic logic circuits, and in particular, to dynamic logic circuits operating with low power supply voltages.

2. Description of the Related Art

Dynamic logic circuitry using complementary metal oxide semiconductor field effect transistors (C-MOSFETs) has seen ever increasing use in recent years because of its advantages of low power consumption, high speed capabilities and small layout area requirements. One common logic cell in such circuits consists of a single P-type MOSFET (P-MOSFET) with a clock input, an N-type MOSFET (N-MOSFET) logic circuit with one or more N-MOSFETs with one or more logic inputs, and a single N-MOSFET with a clock input. The output node is precharged to approximately the power supply voltage VDD by the P-MOSFET and is conditionally discharged to the circuit reference VSS by the logic circuit in cooperation with the single N-MOSFET in accordance with a single-phase clock. The precharge phase occurs when the clock is low (logic 0), thereby turning on the P-MOSFET "precharge" transistor, and the "evaluate" phase occurs when the clock is high (logic 1), thereby turning on the single N-MOSFET "discharge" transistor, or "ground switch." Frequently, a static C-MOSFET inverter cell follows this logic cell so as to allow a single clock signal to precharge and evaluate a cascaded set of such dynamic logic blocks. This type of dynamic logic is often referred to as "domino" logic, further discussion of which can be found in N. H. E. Weste and K. Eshraghian, "Principles of CMOS VLSI Design, A Systems Perspective (Second Edition)," Addison-Wesley Publishing Company, 1993, pp. 301–11 (incorporated herein by reference).

As MOSFET technology has evolved, individual MOSFETs have become steadily smaller, e.g. with smaller feature sizes, particularly shorter channel lengths. This has allowed more and more MOSFETs to be integrated together in one integrated circuit (IC), as well as allow the requisite power supply voltage (VDD) to become smaller as well. Benefits of the former include reduced size and increased operating frequencies, while benefits of the latter include reduced power consumption. However, operating MOSFETs at today's lower power supply voltages has the undesirable effect of lowering MOSFET current which reduces the maximum operating frequency. Hence, in order to minimize reductions in circuit performance, the MOSFET threshold voltages ($V_{TH}$) are reduced so as to minimize reductions in the MOSFET current. (Further discussion of the relationship(s) between power supply voltage, threshold voltage and operating performance for MOSFETs can be found in commonly assigned, copending U.S. patent application Ser. No. 08/292,513, filed Aug. 18, 1994, and entitled "Low Power, High Performance Junction Transistor", the disclosure of which is hereby incorporated herein by reference.) However, this in turn has the undesired effect of increasing MOSFET leakage current, i.e. MOSFET current flowing when the device is turned off. This results in charges leaking to and from the output node of each logic cell which prevents output signal levels from achieving and maintaining full VDD and VSS values, thereby decreasing noise immunity and increasing chances of failure due to data losses caused by charges leaking to or from the output nodes.

Accordingly, it would be desirable to have a dynamic logic circuit having transistors with reduced threshold voltages so as to take maximum advantage of the benefits available from the use of lower power supply voltages while simultaneously minimizing chances of failure due to data losses caused by charge leakage to or from data storage nodes, minimizing reductions in maximum operating frequency and providing improved output signal levels for improved noise immunity.

SUMMARY OF THE INVENTION

In accordance with the present invention, voltage biasing is selectively applied within a dynamic logic circuit to raise its effective transistor threshold voltages during evaluate phases of operation, thereby reducing charge leakage and maintaining peak signal voltage levels. This advantageously allows the logic circuit to have transistors with reduced threshold voltages so as to take maximum advantage of the power-saving benefits available with the use of lower power supply voltages (e.g. less than 3.5 volts) while simultaneously minimizing chances of failure due to data losses caused by charge leakage to or from data storage nodes, minimizing reductions in maximum operating frequency and providing improved output signal levels for improved noise immunity.

An apparatus with a dynamic logic circuit having reduced charge leakage in accordance with one embodiment of the present invention includes reference and precharge nodes, a precharge circuit, a logic circuit and a discharge circuit in which selected voltage biasing is applied to raise the effective transistor threshold voltages during evaluate phases of operation, thereby reducing charge leakage. The reference node establishes a reference voltage. The precharge node receives electrical charges and precharges to a precharged state having a precharge voltage associated therewith and outputs the electrical charges and discharges to a discharged state having a discharge voltage associated therewith. The precharge circuit, coupled to the precharge node, selectively provides the electrical charges to the precharge node. The logic circuit, also coupled to the precharge node, receives a logic signal and in accordance therewith provides a conduction path for the electrical charges outputted from the precharge node. The discharge circuit, coupled to the logic circuit and the reference node, selectively discharges to the reference node the electrical charges outputted from the precharge node via the logic circuit conduction path. The discharge voltage is intermediate to the precharge and reference voltages. In one embodiment the discharge circuit includes an auxiliary bias voltage source, while in another embodiment the discharge circuit includes a pull-up transistor providing a pull-up voltage to a discharge transistor.

These and other features and advantages of the present invention will be understood upon consideration of the following detailed description of the invention and the accompanying drawings.

BRIEF DESCRIPTION OF THE DRAWINGS (Like elements are identified with like alphanumeric designators throughout the drawings.)

DETAILED DESCRIPTION OF THE INVENTION

Figures 1, 1A:
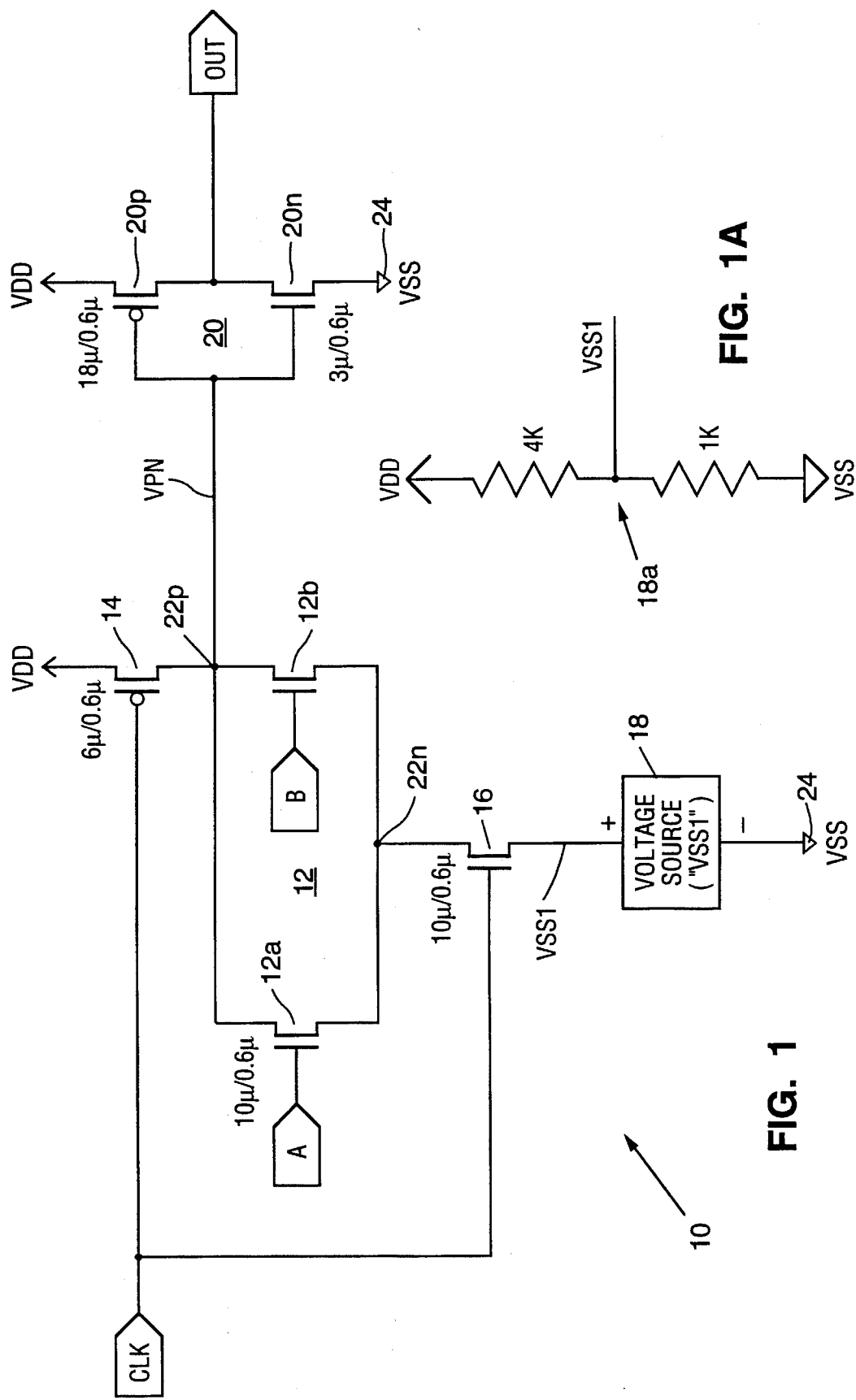
FIG. 1 is a schematic diagram of a dynamic logic circuit in accordance with one embodiment of the present invention.
FIG. 1A is a schematic diagram of an exemplary voltage source for the circuit of FIG. 1.

Throughout the following discussion, unless indicated otherwise, it is assumed that all P-MOSFET and N-MOSFET substrates, or "bulks," are connected to their respective MOSFET sources (e.g. typically to power supply nodes VDD and VSS, respectively). Also, the alphanumeric legends alongside the various transistors indicate their respective channel widths and lengths. (For example, the widths and lengths of the MOSFETS 12a and 12b in FIG. 1 are 10 microns and 0.6 microns, respectively.) It should be understood that such dimensions are intended to be exemplary only and are not intended to require or be limited to any specific semiconductor processing technology, and as semiconductor processing technology advances further such dimensions may be altered, e.g. reduced, as desired. (For example, it should be understood that fabrication of circuitry embodying the present invention can be done in accordance with many well known semiconductor processes or alternatively, in accordance with those processes discussed in the aforementioned U.S. patent application Ser. No. 08/357,436 filed Dec. 16, 1994, and entitled "Asymmetric Low Power MOS Devices", the disclosures of which are both hereby incorporated herein by reference.)

Further, in the following discussion, specific examples of various forms of logic circuits are discussed. However, it should be understood that all logic functions, e.g. inversion, AND, OR, NOR, NAND, EXCLUSIVE-OR, etc., can be realized with reduced charge leakage in accordance with the present invention. Furthermore, the following discussion is in terms of "positive" logic, i.e. where a logic 1 is a logic "high" (e.g. a positive voltage) and a logic 0 is a logic "low" (e.g. approximately equal to the circuit reference potential). However, as discussed further below, it should be understood that logic circuits with reduced charge leakage in accordance with the present invention can be used with "negative" logic as well (i.e. where a logic 1 is a logic "low", e.g. a negative voltage, and a logic 0 is a logic "high", e.g. approximately equal to the circuit reference potential), with P-MOSFETs and N-MOSFETs interchanged appropriately in accordance with well known circuit design principles.

Referring to FIG. 1, a dynamic logic circuit 10 in accordance with one embodiment of the present invention includes a logic circuit 12, precharge P-MOSFET 14, discharge (or "evaluate") N-MOSFET 16, a bias voltage source VSS1 18, a static C-MOSFET inverter 20 and a precharge node 22p, all connected substantially as shown. (The significance of node 22n is discussed further below.) The dynamic logic circuit 10 of FIG. 1 is a 2-input OR gate; however, it should be understood that other logic circuit configurations as mentioned above can be realized by appropriately redesigning the logic circuit 12.

In accordance with well known domino logic principles, when the state of the single-phase clock signal CLK is a logic low, the precharge transistor 14 is turned on and the discharge transistor 16 is turned off. Accordingly, the precharge node 22p is precharged by the electrical charges of the current which flows from the power supply VDD through the precharge transistor 14. This causes the precharge node 22p to reach a precharged state having a precharged voltage VPN(P) associated therewith which is approximately equal to the power supply voltage VDD (minus a small voltage drop across the precharge transistor 14), regardless of the logic states of the input logic signals A, B.

With the precharge node 22p charged to a logic 1 (VPN(P)≈VDD), the output level OUT from the inverter 20 is a logic 0 (≈VSS). When the clock signal CLK becomes a logic high, the precharge transistor 14 is turned off and the discharge transistor 16 is turned on, thereby initiating the "evaluate" phase. Accordingly, depending upon the logic states of the input signals A, B, the precharge node 22p is conditionally discharged, e.g. discharged if one or more of the logic inputs A, B is a logic 1.

In the evaluate phase, if input A or B (or both) is a logic 1, the precharge node 22p will discharge to a discharged state having a discharged voltage VPN(D) associated therewith. This discharge voltage VPN(D) would approximately equal VSS in a conventional dynamic logic circuit. However, in accordance with the present invention, this discharge voltage VPN(D) has a value intermediate to the precharge voltage level VPN(P) and the circuit reference voltage VSS associated with the circuit reference node 24. This intermediate voltage level is VSS1, and is determined by the voltage source 18. (This dynamic logic circuit 10 can be thought of as having a "dual" circuit ground, since the bias voltage VSS1 serves as a "virtual ground" for the discharge transistor 16.)

The voltage source 18 can be realized in accordance with any of many well known techniques. For example, referring to FIG. 1A, a simple voltage source 18 can consist of a resistive voltage divider network 18A. (Such resistors can be realized using MOSFETS designed in accordance with well known techniques.)

The voltage VSS1 provided at the source of the discharge transistor 16 is designed to be intermediate to VDD and VSS. When the MOSFET threshold voltage ($V_{TH}$) is negative, VSS1 is slightly higher in voltage than VSS by an amount equal to the sum of the absolute value of the MOSFET threshold voltage ($V_{TH}$) plus a predetermined design margin voltage. But, if the MOSFET threshold voltage ($V_{TH}$) is positive, VSS1 is slightly higher in voltage than VSS by an amount equal to the predetermined design margin voltage. In any event, this causes the source-to-gate bias on the discharge transistor 16 to be sufficiently high to ensure that the gate-to-source bias on the discharge transistor 16 is sufficiently below the threshold voltage during the precharge phase when the clock signal CLK is a logic 0, e.g. to ensure that the discharge transistor 16 is reverse-biased. This, in turn, ensures that substantially no leakage of charges from the precharge node 22p occurs through the discharge transistor 16 to the reference node 24. Additionally, during the evaluate phase when the clock signal CLK is a logic 1 and the logic inputs A and B are inactive (i.e. at logic 0), VSS1 ensures that MOSFETS 12a and 12b are reverse-biased, thereby ensuring that substantially no leakage of charges from the precharge node 22p occurs through the MOSFETs 12a and 12b and the discharge transistor 16 to the reference node 24.

Figure 2:
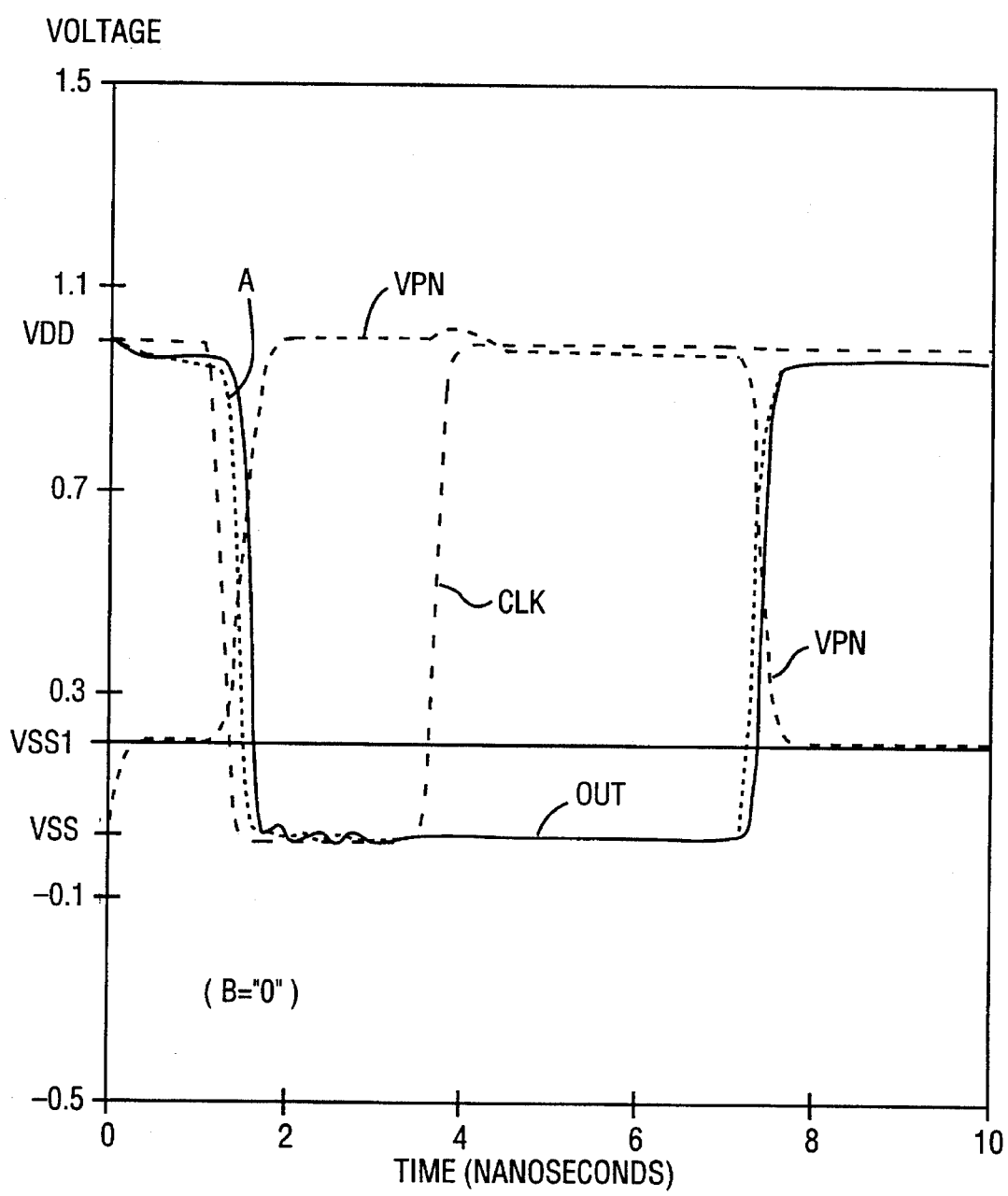
FIG. 2 is voltage versus time plot for the circuit of FIG. 1.

Referring to FIG. 2, a voltage versus time plot is illustrated for the dynamic logic circuit of FIG. 1 where VDD is 1 volt, VSS is circuit ground (0 volt), the bias voltage VSS1 is 0.2 volt and the second logic input B is a logic 0. As can be seen, the precharge node voltage VPN charges to approximately VDD during the precharge phase, i.e. when the clock signal CLK is a logic 0. During the evaluate phase, i.e. when the clock signal CLK is a logic 1, the precharge node voltage VPN discharges to its discharge value of approximately VSS1 in response to the transition of logic input A from a logic 0 to a logic 1. Accordingly, the output level OUT from the inverter 20 also transitions from its initial "precharge" value of logic 0 (≈VSS) to logic 1 (≈VDD).

Figure 3:
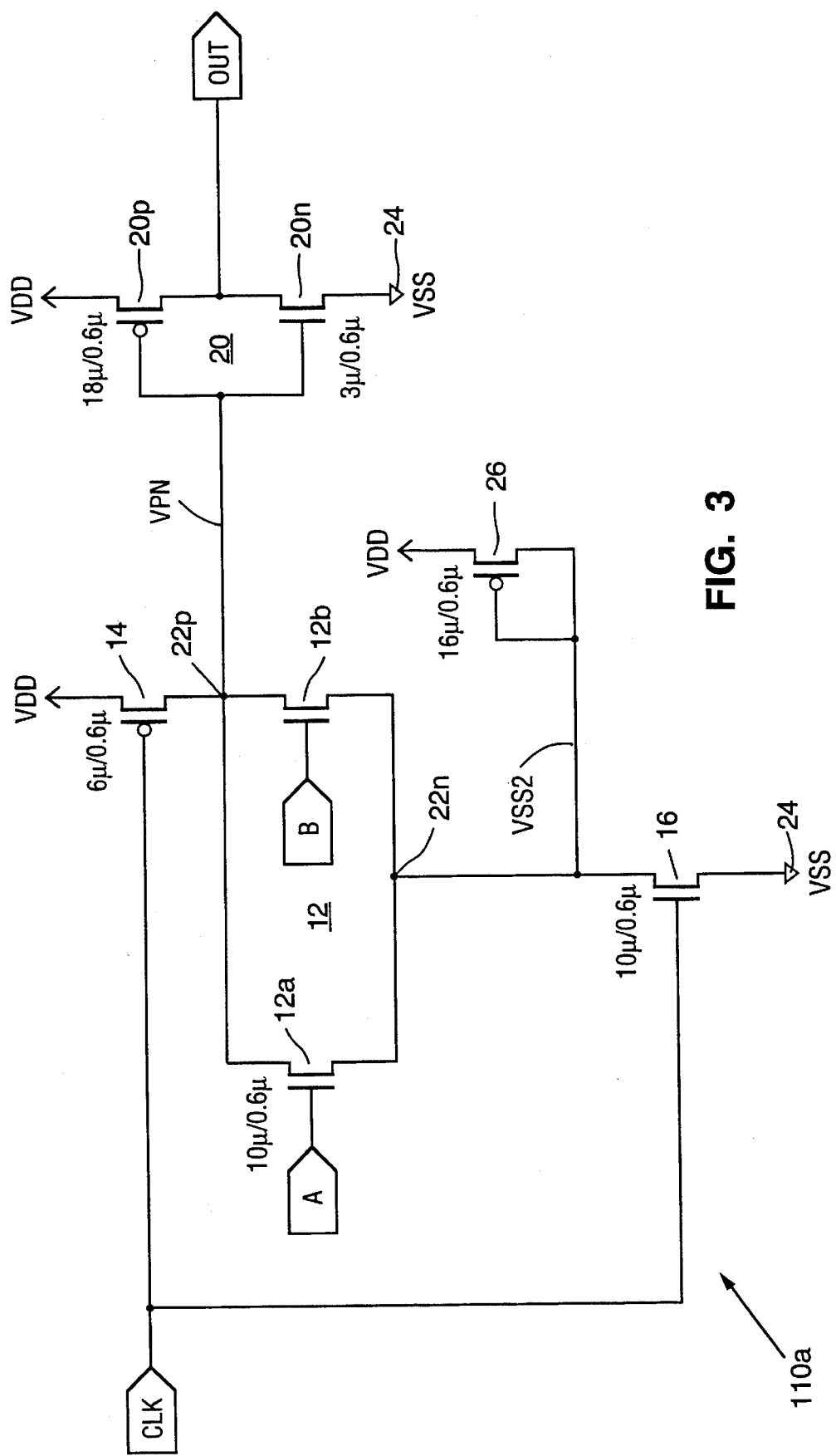
FIG. 3 is a schematic diagram of a dynamic logic circuit in accordance with another embodiment of the present invention.

Referring to FIG. 3, a dynamic logic circuit 110a in accordance with another embodiment of the present invention includes a logic circuit 12, precharge transistor 14, discharge transistor 16 and inverter 20, as discussed above, plus a pull-up P-MOSFET 26, all connected substantially as shown. Operation of this dynamic logic circuit 110a is similar to that as described above for the logic circuit 10 of FIG. 1, except that instead of using a discrete voltage source 18 to compensate for the reduced MOSFET threshold voltages, a pull-up transistor 26 pulls up the drain of the discharge transistor 16 to a voltage level VSS2 which is slightly higher than the circuit reference voltage VSS at the reference node 24. During the precharge phase, i.e. when the clock signal CLK is logic 0, any electrical charge which leaks off of the precharge node 22p through the discharge transistor 16 (via the logic circuit 12) is replenished via current through the pull-up transistor 26 from the power supply VDD. Accordingly, precharging of the precharge node 22p remains intact with its voltage level VPN(P) maintained at approximately VDD. During the evaluate phase, i.e. when the clock signal CLK is logic 1, the precharge node 22p is conditionally discharged through the logic circuit 12 and discharge transistor 16 to the reference node 24. However, the discharge voltage level VPN(D) of the precharge node voltage VPN reaches its minimum at VSS2, due to the pull-up action of the pull-up transistor 26.

Figures 3A, 3B, 3C:
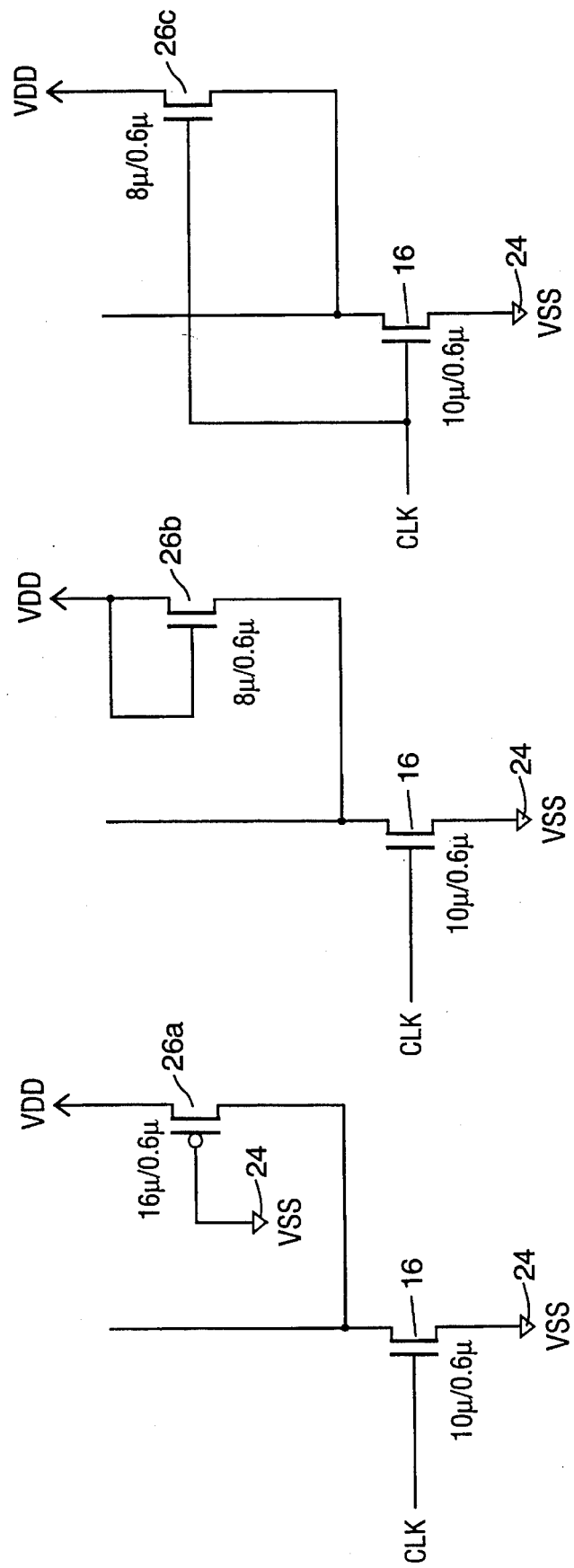
FIGS. 3A, 3B and 3C are schematic diagrams of exemplary pull-up transistors suitable for use in the circuit of FIG. 3.

Referring to FIGS. 3A, 3B and 3C, it can be seen that various configurations of pull-up transistors 26a, 26b and 26c, respectively, can be used to realize the advantages and benefits of the dynamic logic circuit 110a of FIG. 3.

Figure 4:
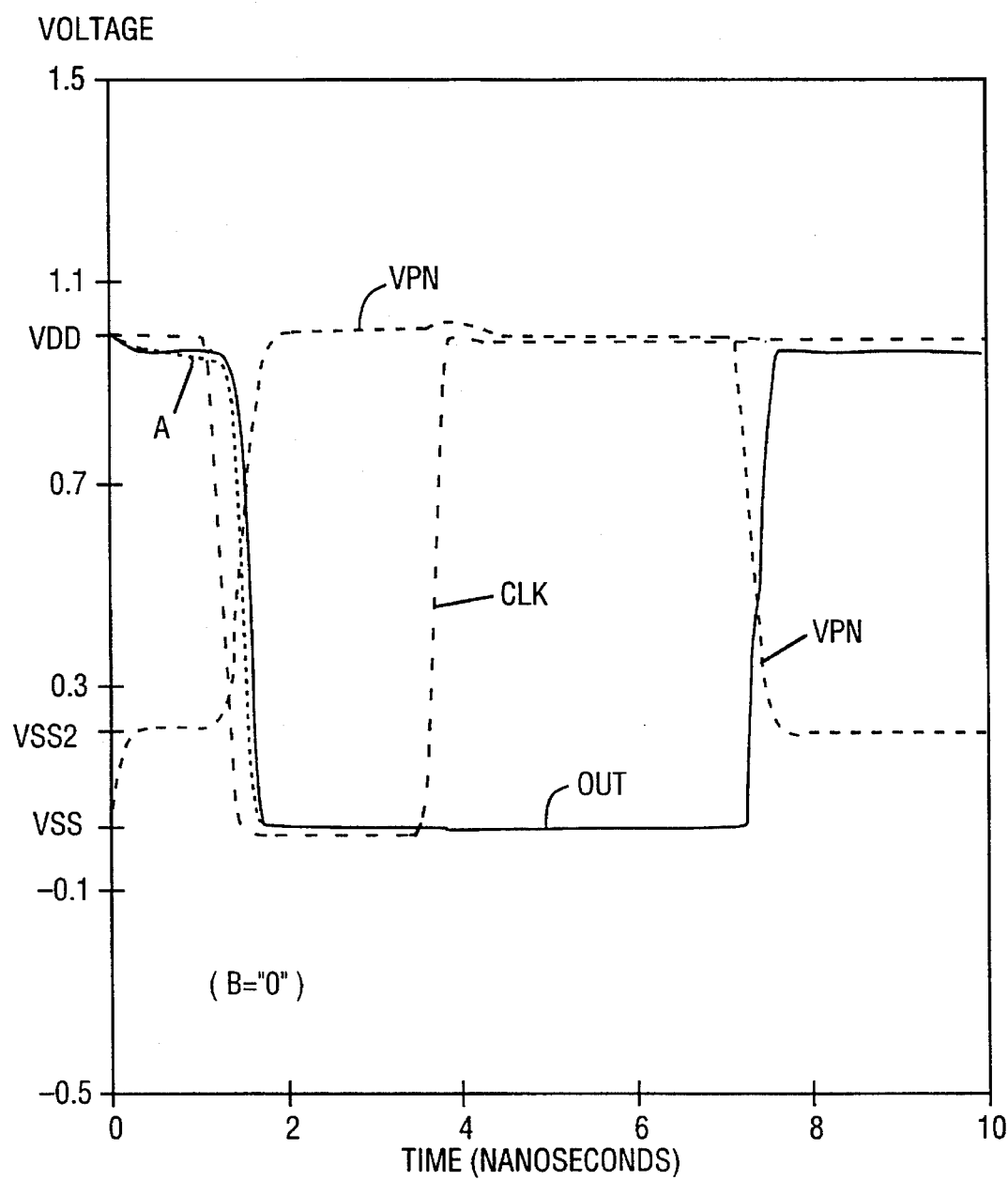
FIG. 4 is a voltage versus time plot for the circuit of FIG. 3.

Referring to FIG. 4, a voltage versus time plot for the dynamic logic circuit 110a of FIG. 3 is illustrated. As can be seen, during the precharge phase, i.e. when the clock signal CLK is logic 0, the precharge node voltage VPN reaches a value of approximately VDD and discharges to the intermediate voltage level of VSS2 upon the occurrence of a low-to-high transition of logic input A.

Figure 5:
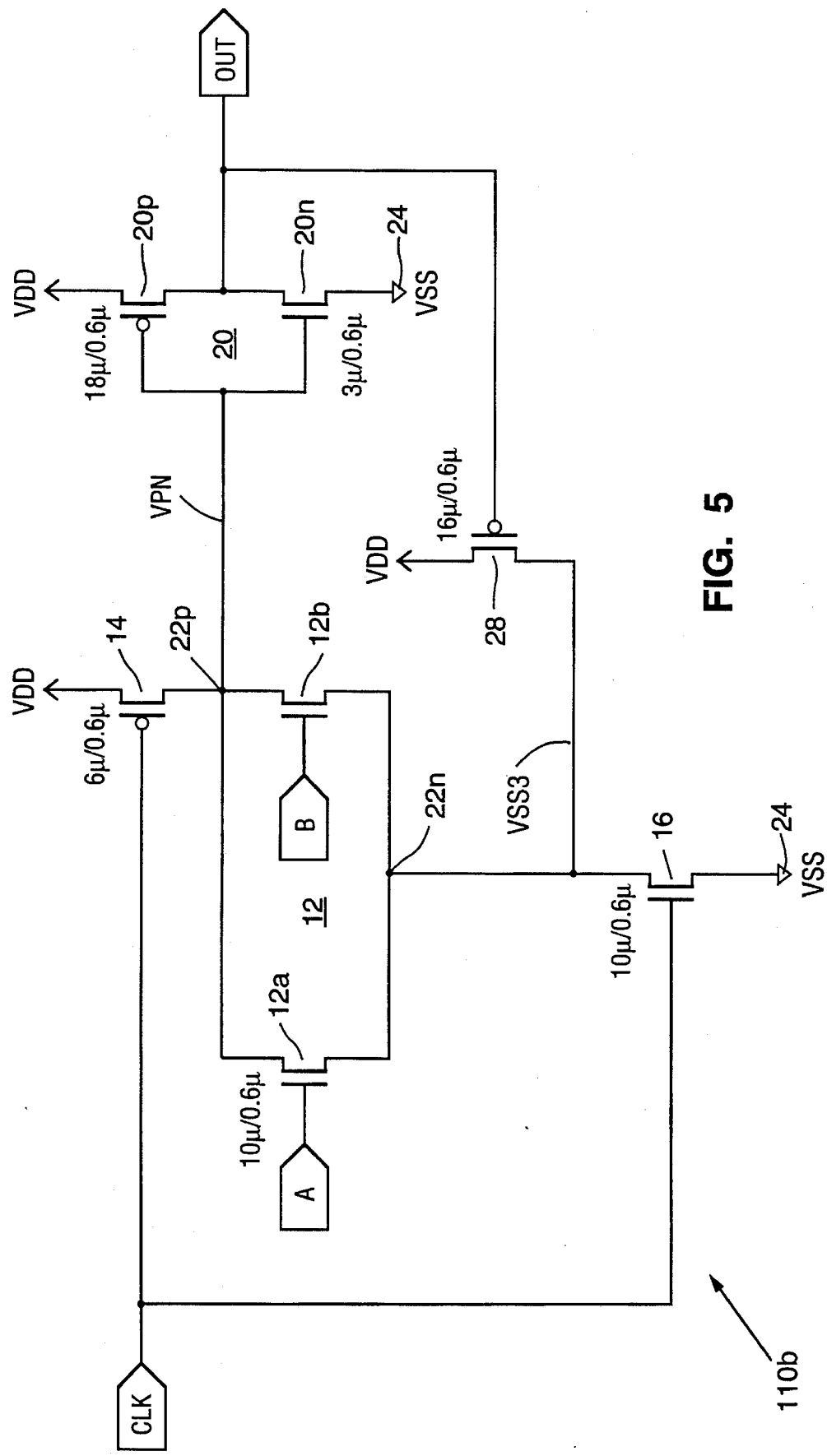
FIG. 5 is a schematic diagram of a dynamic logic circuit in accordance with still another embodiment of the present invention.

Referring to FIG. 5, a dynamic logic circuit 110b in accordance with still another embodiment of the present invention, includes a logic circuit 12, precharge transistor 14, discharge transistor 16 and inverter 20, as discussed above for the dynamic logic circuit 10 of FIG. 1, plus a switched pull-up P-MOSFET 28, all connected substantially as shown. The operation of this dynamic logic circuit 110b is similar to that as described above for the dynamic logic circuits 10 and 110a of FIGS. 1 and 3, respectively, with the exception of the pull-up operation of the pull-up transistor 28. In this logic circuit 110b, the output signal OUT controls the pull-up action of the pull-up transistor 28 with respect to the drain of the discharge transistor 16. During the precharge phase, i.e. when the precharge node voltage VPN is high and the output voltage OUT is low (≈VSS), the pull-up transistor 28 is turned on, thereby providing any leakage current drawn by the discharge transistor 16 as discussed above for FIG. 3. During the evaluate phase, when the precharge node voltage VPN remains high, and therefore the output voltage OUT remains low, the pull-up transistor 28 remains turned on. However, when the precharge node 22p is discharged and its voltage level VPN drops to its discharge value VPN(D), the output voltage OUT becomes a logic 1 (≈VDD) and turns the pull-up transistor 28 off. This allows the voltage VSS3 at the drain of the discharge transistor 16 to then decrease to approximately the reference voltage VSS at the reference node 24.

Figure 6:
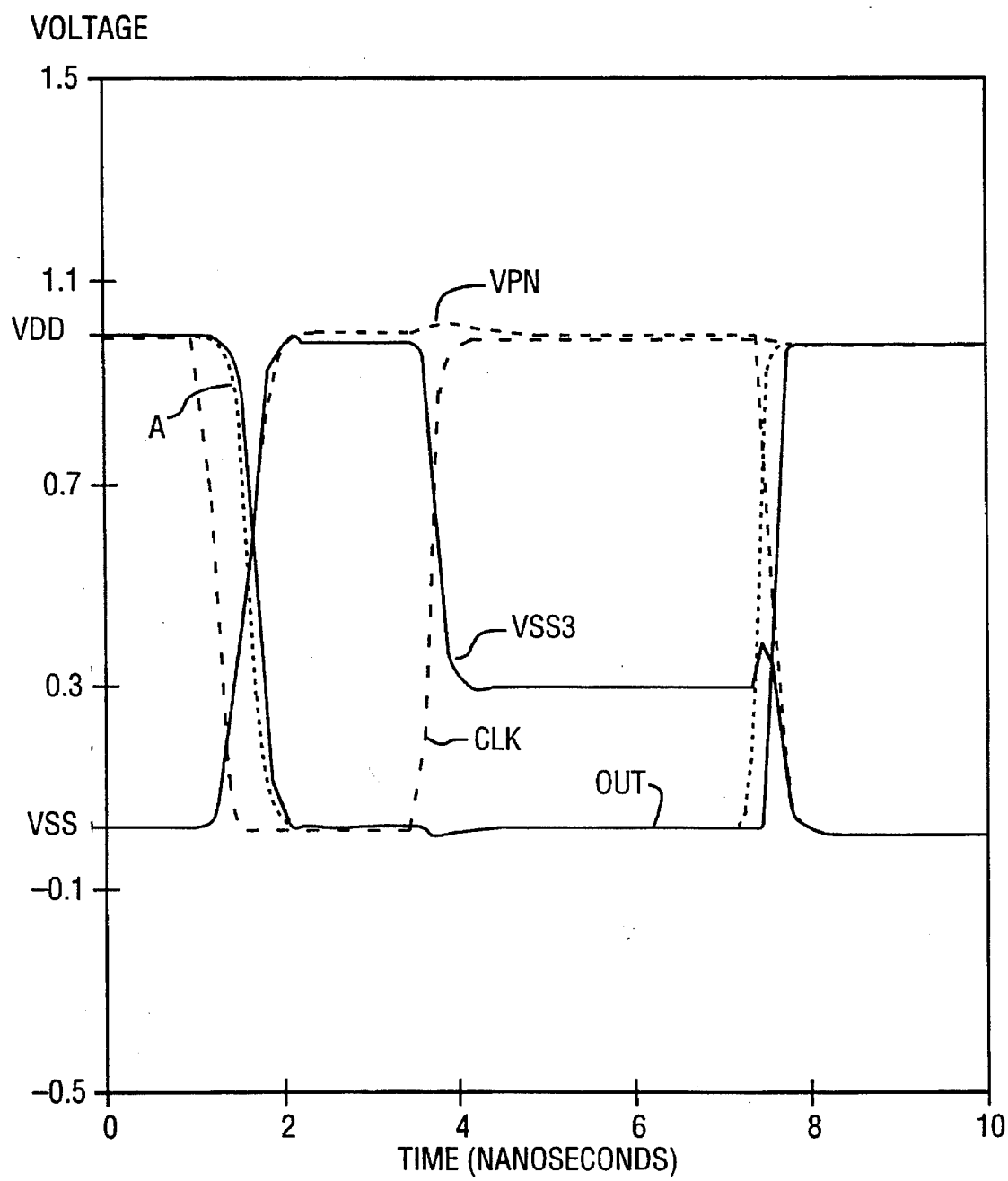
FIG. 6 is a voltage versus time plot for the circuit of FIG. 5.

Referring to FIG. 6, the above-discussed operation of the dynamic logic circuit 110b of FIG. 5 can be better understood by referring to the illustrated voltage versus time plot. As can be seen, during the precharge phase, i.e. when the clock signal CLK is a logic 0, the precharge voltage VPN charges to approximately VDD as does the drain voltage VSS3 of the discharge transistor 16 due to the pull-up action of the pull-up transistor 28 turned on by the low output voltage OUT. During the evaluate phase, i.e. when the clock signal CLK is a logic 1, the drain voltage VSS3 of the discharge transistor 16 falls to a level established by the voltage divider action of the two conducting MOSFET channels of the discharge 16 and pull-up 28 transistors (in this case, approximately 0.3 volt). Upon the occurrence of a low-to-high transition of logic input A, the precharge node voltage VPN discharges, as does the drain voltage VSS3 of the discharge transistor 16, to approximately VSS due to the termination of the pull-up action of the pull-up transistor 28 which is turned off by the now-high (logic 1) output voltage OUT.

Figure 7:
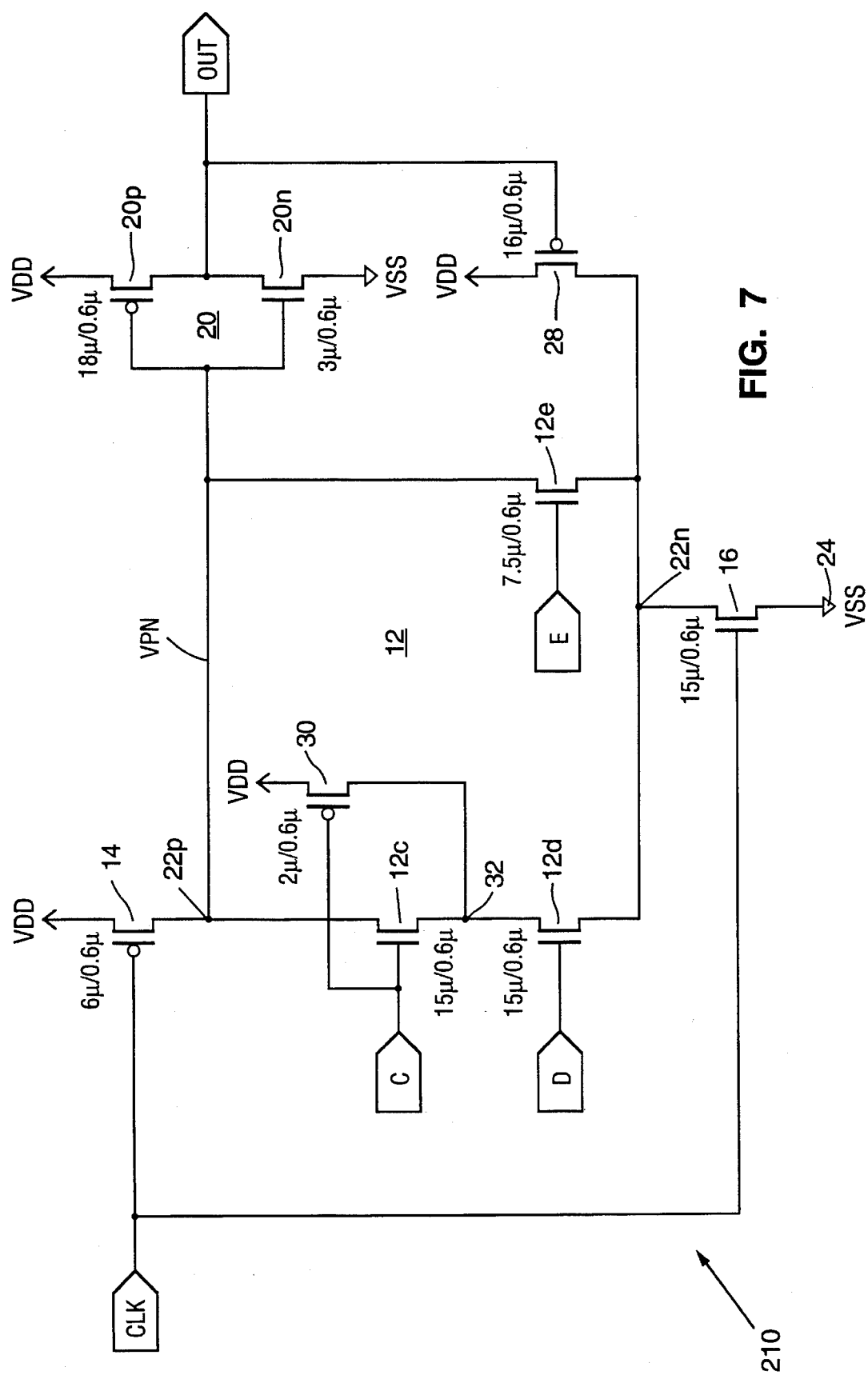
FIG. 7 is a schematic diagram of a more complex dynamic logic circuit in accordance with the present invention.

Referring to FIG. 7, the advantages and behests of a dynamic logic circuit in accordance with the present invention can be realized in more complex circuits such as the dynamic logic circuit 210 shown. In this configuration, input logic signals C and D are logically ANDed, with the result thereof being logically ORed with logic input E, with that result, in turn, being inverted by the inverter 20. In accordance with the foregoing discussion, a pull-up transistor 28, switched by the output voltage OUT, is used to supply and leakage current drawn by the discharge transistor 16 during the precharge phase. Also, a "keeper" P-MOSFET 30 is used on the input transistor 12c for logic signal C so as to prevent charge sharing between the precharge node 22p and node 32 during both the precharge and evaluate phases.

In accordance with the foregoing discussion, it should be understood that circuits with reduced charge in accordance with the present invention can also be realized for operation with negative logic. For example, negative logic implementations of the exemplary logic circuits 10, 110a, 110b, 210 of FIGS. 1, 3, 5 and 7 can be realized by: (1) using negative logic clock CLK and input logic signals B, C, D, E; (2) replacing the N-MOSFETs 12a, 12b, 12c, 12d, 12e forming the logic circuits 12 with P-MOSFETs; (3) using node 22n as the precharge node (instead of node 22p) by connecting the input of the inverter 20 thereto; and (4) replacing the "keeper" P-MOSFETs 26, 28 biased by VDD with N-MOS- FETs biased by VSS. By discussing charge and current flow in terms of "electron" charge/current flow (i.e. negative-to-positive) instead of in terms of "conventional" charge/current flow (i.e positive-to-negative) as done above, the operation of such negative logic implementations can then be described in accordance with the foregoing discussion, e.g. with node 22n "precharging" to VSS and then conditionally "discharging" to VDD.

Figure 8:
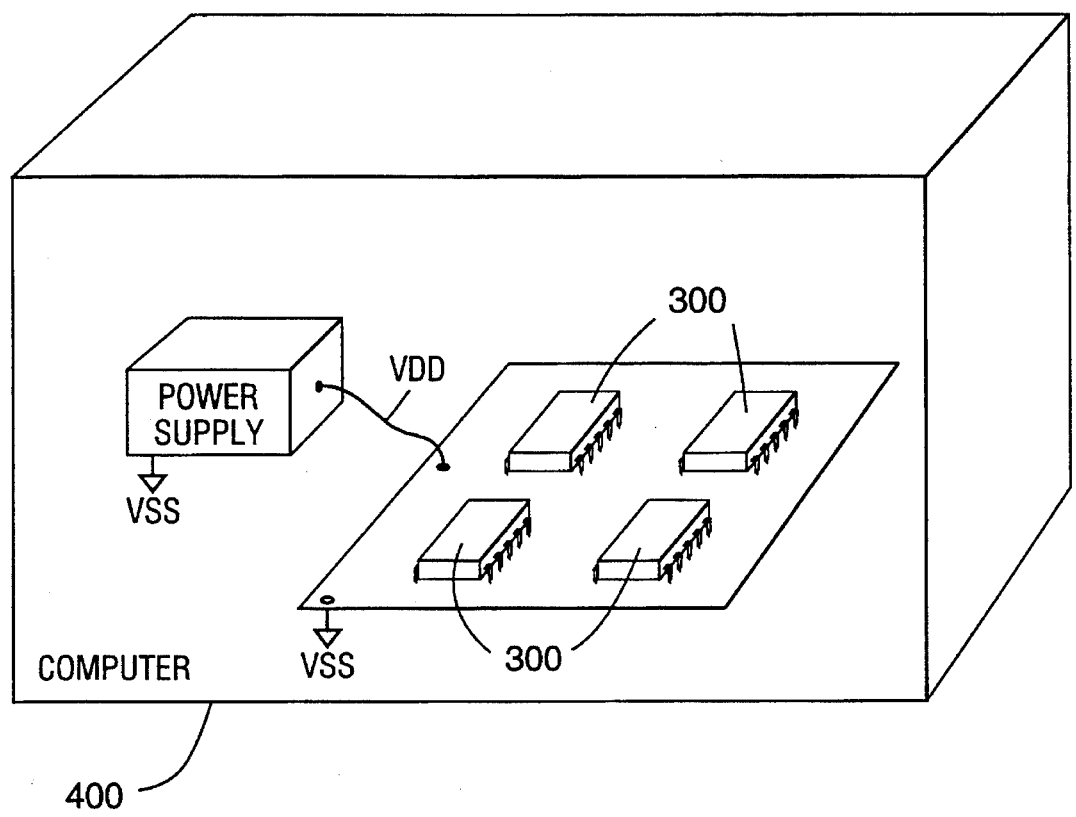
FIG. 8 represents the integration of a dynamic logic circuit in accordance with the present invention within an integrated circuit and the incorporation thereof within a computer.

Referring to FIG. 8, a dynamic logic circuit in accordance with the present invention (e.g. the dynamic logic circuits 10, 110a, 110b and 210 of FIGS. 1, 3, 5 and 7, respectively) can be used perhaps most advantageously when integrated within an integrated circuit (IC) 300. In accordance with the foregoing discussion, the IC 300 can be designed to have a number of such dynamic logic circuits 10/110a/110b/210 integrated therein with transistors having reduced threshold voltages so as to take maximum advantage of the power-saving benefits available with the use of lower power supply voltages (e.g. less than 3 volts) while simultaneously minimizing chances of failure due to data losses caused by charge leakage to or from data storage nodes, minimizing reductions in maximum operating frequency and providing improved output signal levels for improved noise immunity. For example, by incorporating a number of such ICs 300 into a computer 400, the system power supply requirements (e.g. output power levels, filtering, etc.) and system cooling requirements (e.g. fan size and power, quantities and sizes of heat sinks, air filters, etc.) can be relaxed, thereby resulting in a lighter, cooler-operating system.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a dynamic logic circuit with reduced charge leakage, said logic circuit comprising:

a reference node for having a reference voltage associated therewith;

a precharge node for receiving a plurality of electrical charges and precharging to a precharged state having a precharge voltage associated therewith and for outputting said plurality of electrical charges and discharging to a discharged state having a discharge voltage associated therewith;

a precharge circuit, coupled to said precharge node, for selectively providing said plurality of electrical charges to said precharge node;

a logic circuit, coupled to said precharge node, for receiving a logic signal and in accordance therewith providing a conduction path for said plurality of electrical charges outputted from said precharge node; and a discharge circuit, coupled to said logic circuit and said reference node, for selectively discharging to said reference node said plurality of electrical charges outputted from said precharge node via said logic circuit conduction path, wherein said discharge voltage is intermediate to said precharge and reference voltages.

2. An apparatus as recited in claim 1, wherein said precharge circuit provides said plurality of electrical charges to said precharge node during a first clock signal state and said discharge circuit discharges to said reference node said plurality of electrical charges outputted from said precharge node via said logic circuit conduction path during a second clock signal state.

3. An apparatus as recited in claim 1, wherein said discharge circuit is selectively reverse-biased during one of a plurality of clock signal states.

4. An apparatus as recited in claim 1, wherein said precharge circuit comprises a P-type MOSFET.

5. An apparatus as recited in claim 1, wherein said logic circuit comprises at least one N-type MOSFET for logically processing said logic signal.

6. An apparatus as recited in claim 1, wherein said discharge circuit comprises:

a bias voltage source, coupled to said reference node, for providing a bias voltage which is intermediate to said precharge and reference voltages, wherein said discharge voltage is approximately equal to said bias voltage; and a discharge transistor, coupled to said logic circuit and said bias voltage source, for receiving said bias voltage and selectively discharging to said reference node via said bias voltage source said plurality of electrical charges outputted from said precharge node via said logic circuit conduction path.

7. An apparatus as recited in claim 1, wherein said discharge circuit comprises:

a discharge transistor, coupled to said logic circuit and said reference node, for receiving a pull-up voltage and selectively discharging to said reference node said plurality of electrical charges outputted from said precharge node via said logic circuit conduction path; and a pull-up transistor, coupled to said discharge transistor, for providing said pull-up voltage.

8. An apparatus as recited in claim 1, further comprising an inverter, coupled to said precharge node, for buffering said precharge and discharge voltages to provide a buffered output signal.

9. An apparatus as recited in claim 8, wherein said discharge circuit comprises:

a discharge transistor, coupled to said logic circuit and said reference node, for receiving a pull-up voltage and selectively discharging to said reference node said plurality of electrical charges outputted from said precharge node via said logic circuit conduction path; and a pull-up transistor, coupled to said discharge transistor and said inverter, for receiving said buffered output signal and in accordance therewith providing said pull-up voltage.

10. An apparatus as recited in claim 1, further comprising an integrated circuit into which said dynamic logic circuit is integrated.

11. An apparatus as recited in claim 1, further comprising a computer into which said dynamic logic circuit is incorporated.

12. A method of providing an apparatus including a dynamic logic circuit with reduced charge leakage, said method comprising the steps of:

providing a reference node for having a reference voltage associated therewith;

providing a precharge node for receiving a plurality of electrical charges and precharging to a precharged state having a precharge voltage associated therewith and for outputting said plurality of electrical charges and discharging to a discharged state having a discharge voltage associated therewith;

providing a precharge circuit, coupled to said precharge node, for selectively providing said plurality of electrical charges to said precharge node;

providing a logic circuit, coupled to said precharge node, for receiving a logic signal and in accordance therewith providing a conduction path for said plurality of electrical charges outputted from said precharge node; and providing a discharge circuit, coupled to said logic circuit and said reference node, for selectively discharging to said reference node said plurality of electrical charges outputted from said precharge node via said logic circuit conduction path, wherein said discharge voltage is intermediate to said precharge and reference voltages.

13. A method as recited in claim 12, wherein said step of providing a precharge circuit comprises providing a precharge circuit which provides said plurality of electrical charges to said precharge node during a first clock signal state, and wherein said step of providing a discharge circuit comprises providing a discharge circuit which discharges to said reference node said plurality of electrical charges outputted from said precharge node via said logic circuit conduction path during a second clock signal state.

14. A method as recited in claim 12, wherein said step of providing a discharge circuit comprises providing a discharge circuit which is selectively reverse-biased during one of a plurality of clock signal states.

15. A method as recited in claim 12, wherein said step of providing a precharge circuit comprises providing a P-type MOSFET.

16. A method as recited in claim 12, wherein said step of providing a logic circuit comprises providing at least one N-type MOSFET for logically processing said logic signal.

17. A method as recited in claim 12, wherein said step of providing a discharge circuit comprises the steps of:

providing a bias voltage source, coupled to said reference node, for outputting a bias voltage which is intermediate to said precharge and reference voltages, wherein said discharge voltage is approximately equal to said bias voltage; and providing a discharge transistor, coupled to said logic circuit and said bias voltage source, for receiving said bias voltage and selectively discharging to said reference node via said bias voltage source said plurality of electrical charges outputted from said precharge node via said logic circuit conduction path.

18. A method as recited in claim 12, wherein said step of providing a discharge circuit comprises the steps of:

providing a discharge transistor, coupled to said logic circuit and said reference node, for receiving a pull-up voltage and selectively discharging to said reference node said plurality of electrical charges outputted from said precharge node via said logic circuit conduction path; and providing a pull-up transistor, coupled to said discharge transistor, for outputting said pull-up voltage.

19. A method as recited in claim 12, further comprising the step of providing an inverter, coupled to said precharge node, for buffering said precharge and discharge voltages to provide a buffered output signal.

20. A method as recited in claim 19, wherein said step of providing a discharge circuit comprises the steps of:

providing a discharge transistor, coupled to said logic circuit and said reference node, for receiving a pull-up voltage and selectively discharging to said reference node said plurality of electrical charges outputted from said precharge node via said logic circuit conduction path; and providing a pull-up transistor, coupled to said discharge transistor and said inverter, for receiving said buffered output signal and in accordance therewith outputting said pull-up voltage.

21. A method as recited in claim 12, further comprising the step of providing an integrated circuit into which said dynamic logic circuit is integrated.

22. A method as recited in claim 12, further comprising the step of providing a computer into which said dynamic logic circuit is incorporated.

23. A method of dynamically, logically processing a logic signal with reduced charge leakage, said method comprising the steps of:

establishing a reference node having a reference voltage associated therewith;

precharging a precharge node with a plurality of electrical charges to a precharged state having a precharge voltage associated therewith;

receiving a logic signal and in accordance therewith providing a conduction path;

outputting said plurality of electrical charges from said precharge node via said conduction path and discharging said precharge node to a discharged state having a discharge voltage associated therewith; and selectively discharging to said reference node said plurality of electrical charges outputted from said precharge node via said conduction path, wherein said discharge voltage is intermediate to said precharge and reference voltages.

24. A method as recited in claim 23, wherein said step of precharging a precharge node with a plurality of electrical charges to a precharged state having a precharge voltage associated therewith comprises precharging said precharge node during a first clock signal state, and wherein said step of selectively discharging to said reference node said plurality of electrical charges outputted from said precharge node via said conduction path comprises discharging to said reference node said plurality of electrical charges outputted from said precharge node via said conduction path during a second clock signal state.

25. A method as recited in claim 23, wherein said step of selectively discharging to said reference node said plurality of electrical charges outputted from said precharge node via said conduction path comprises selectively reverse-biasing a discharge circuit during one of a plurality of clock signal states.

26. A method as recited in claim 23, wherein said step of precharging a precharge node with a plurality of electrical charges to a precharged state having a precharge voltage associated therewith comprises precharging said precharge node with a P-type MOSFET.

27. A method as recited in claim 23, wherein said step of receiving a logic signal and in accordance therewith providing a conduction path comprises receiving and logically processing said logic signal with at least one N-type MOSFET and in accordance therewith providing said conduction path.

28. A method as recited in claim 23, wherein said step of selectively discharging to said reference node said plurality of electrical charges outputted from said precharge node via said conduction path comprises receiving a bias voltage which is intermediate to said precharge and reference voltages and in accordance therewith selectively discharging to said reference node via said bias voltage source said plurality of electrical charges outputted from said precharge node via said conduction path, wherein said discharge voltage is approximately equal to said bias voltage.

29. A method as recited in claim 23, wherein said step of selectively discharging to said reference node said plurality of electrical charges outputted from said precharge node via said conduction path comprises receiving a pull-up voltage via a pull-up transistor and selectively discharging to said reference node said plurality of electrical charges outputted from said precharge node via said conduction path.

30. A method as recited in claim 23, further comprising the step of receiving and inverting said precharge and discharge voltages from said precharge node to provide a buffered output signal.

31. A method as recited in claim 30, wherein said step of selectively discharging to said reference node said plurality of electrical charges outputted from said precharge node via said conduction path comprises receiving said buffered output signal and in accordance therewith receiving a pull-up voltage via a pull-up transistor and selectively discharging to said reference node said plurality of electrical charges outputted from said precharge node via said conduction path.

32. A method as recited in claim 23, wherein said method steps of dynamically, logically processing a logic signal with a precharge node with reduced charge leakage are performed within an integrated circuit.

33. A method as recited in claim 23, wherein said method steps of dynamically, logically processing a logic signal with a precharge node with reduced charge leakage are performed within a computer.

\* \* \* \* \*